(12) United States Patent
Gallagher et al.

(10) Patent No.: US 8,911,927 B2
(45) Date of Patent: Dec. 16, 2014

(54) COMPOSITIONS AND PROCESSES FOR IMMERSION LITHOGRAPHY

(75) Inventors: Michael K. Gallagher, Hopkinton, MA (US); Gerald B. Wayton, Leicester, MA (US); Gregory P. Prokopowicz, Lancaster, MA (US); Stewart A. Robertson, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 12/862,639

(22) Filed: Aug. 24, 2010

(65) Prior Publication Data

US 2011/0123937 A1 May 26, 2011

Related U.S. Application Data

(63) Continuation of application No. 11/173,932, filed on Jul. 1, 2005, now Pat. No. 7,781,141.

(60) Provisional application No. 60/585,119, filed on Jul. 2, 2004.

(51) Int. Cl.
*G03F 7/11* (2006.01)
*G03F 7/38* (2006.01)
*G03F 7/40* (2006.01)

(52) U.S. Cl.
USPC ...... 430/270.1; 430/330; 430/331; 430/273.1

(58) Field of Classification Search
USPC ............... 430/270.1, 330, 272.1, 273.1, 331
IPC ............... G03F 7/004,7/11, 7/2041, 7/40, 7/38
See application file for complete search history.

(56) References Cited

U.S. PATENT DOCUMENTS

| | | | |
|---|---|---|---|
| 4,617,057 A | 10/1986 | Plueddemann | |
| 5,426,017 A * | 6/1995 | Johnson | 430/331 |
| 6,788,477 B2 | 9/2004 | Lin | |
| 7,320,855 B2 * | 1/2008 | Huang et al. | 430/311 |
| 7,335,319 B2 * | 2/2008 | Peterson et al. | 252/364 |
| 7,361,612 B2 * | 4/2008 | Choi et al. | 438/780 |
| 7,629,110 B2 * | 12/2009 | Kim et al. | 430/313 |
| 7,776,506 B2 * | 8/2010 | Wang et al. | 430/270.1 |
| 7,781,141 B2 * | 8/2010 | Gallagher et al. | 430/270.1 |
| 2003/0227005 A1 * | 12/2003 | Peterson et al. | 252/364 |
| 2004/0075895 A1 | 4/2004 | Lin | |
| 2005/0089792 A1 * | 4/2005 | Huang et al. | 430/270.1 |
| 2005/0106494 A1 * | 5/2005 | Huang et al. | 430/270.1 |
| 2005/0123863 A1 | 6/2005 | Chang et al. | |
| 2005/0175940 A1 | 8/2005 | Dierichs | |
| 2005/0202340 A1 | 9/2005 | Houlihan et al. | |
| 2005/0202347 A1 | 9/2005 | Houlihan et al. | |
| 2005/0202351 A1 | 9/2005 | Houlihan et al. | |
| 2005/0238991 A1 | 10/2005 | Jung | |
| 2005/0239296 A1 | 10/2005 | Jung | |
| 2005/0250898 A1 | 11/2005 | Maeda et al. | |
| 2005/0255414 A1 | 11/2005 | Inabe et al. | |
| 2005/0266354 A1 | 12/2005 | Li et al. | |
| 2005/0277059 A1 | 12/2005 | Kanda | |
| 2005/0277069 A1 | 12/2005 | Endo et al. | |
| 2006/0008732 A1 | 1/2006 | Jung | |
| 2006/0024613 A1 | 2/2006 | Otozawa et al. | |
| 2006/0029884 A1 * | 2/2006 | Hatakeyama et al. | 430/270.1 |
| 2006/0093959 A1 | 5/2006 | Huang et al. | |
| 2006/0111550 A1 | 5/2006 | Hata et al. | |
| 2006/0141400 A1 | 6/2006 | Hirayama et al. | |
| 2006/0154170 A1 | 7/2006 | Endo et al. | |

FOREIGN PATENT DOCUMENTS

| | | |
|---|---|---|
| EP | 0 239 108 A2 | 9/1987 |
| JP | 2005352384 A | 12/2005 |

OTHER PUBLICATIONS

European Search Report Issued Feb. 17, 2006 in connection with corresponding European Patent Application No. 05254170.3.
Japanese Final Office Action Issued Aug. 24, 2011 in connection with corresponding Japanese Patent Application No. 2005-193666.
J.H. Chen et al., "Characterization of ArF immersion process for production", Proceedings of the SPIE, vol. 5754, No. 1, pp. 13-22 (2004).
J.C. Jung et al., "Quencher gradient resist process for low k process", Proceedings of the SPIE, vol. 5376, No. 1, pp. 63-70 (2004).
T. Hagiwara et al., "Liquid immersion lithography at 157 nm", Proceedings of the SPIE, vol. 5754, No. 1, pp. 435-446 (2004).

* cited by examiner

*Primary Examiner* — Amanda C. Walke
(74) *Attorney, Agent, or Firm* — Edwards Wildman Palmer LLP; Peter F. Corless

(57) ABSTRACT

The present invention relates to barrier layer compositions that are applied above a photoresist composition for immersion lithography processing. In a further aspect, new methods are provided for immersion lithography processing.

10 Claims, No Drawings

COMPOSITIONS AND PROCESSES FOR IMMERSION LITHOGRAPHY

The present application is a continuation of U.S. application Ser. No. 11/173,932, filed Jul. 1, 2005, now U.S. Granted Pat. No. 7,781,141 which claims the benefit of U.S. Provisional Application No. 60/585,119, filed Jul. 2, 2004, the entire contents of which applications are incorporated herein by reference.

The present invention relates to barrier layer compositions that are applied above a photoresist composition for immersion lithography processing. In a further aspect, new methods are provided for immersion lithography processing.

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

The growth of the semiconductor industry is driven by Moore's law which states that the complexity of an IC device doubles on average every two years. This necessitates the need to lithographically transfer patterns and structures with ever decreasing feature size.

One approach to achieving smaller feature sizes is to use shorter wavelengths of light, however, the difficulty in finding materials that are transparent below 193 nm has led to the option of using immersion lithography to increase the numerical aperture of the lens by simply using a liquid to focus more light into the film. Immersion lithography employs a relatively high refractive index fluid between the last surface of an imaging device (e.g., KrF or ArF stepper) and the first surface on a wafer or other substrate.

Immersion microscopy has reported as a method for increasing the numerical aperture of a lens by using a liquid with an index of refraction greater than air. The improvement can be quantified and the minimum line width, W, is calculated as follows:

$$W = k_1 \lambda / NA \qquad \text{Eq. 1}$$

where $k_1$ is the resolution factor, $\lambda$ is the wavelength of light and NA is the numerical aperture.

For air which has an index of refraction of 1, the practical limit of the numerical aperture is 0.93. For materials with index greater than 1, NA greater than 1 are achievable based on the following formula:

$$NA = n \sin(\alpha) = d/(2f) \qquad \text{Eq. 2}$$

substituting for NA it is the equation can be simplified as shown below:

$$W = k_1 \lambda / n \sin(\alpha) \qquad \text{Eq. 3}$$

where n is the index of refraction of the immersion fluid and $\alpha$ is the acceptance angle of the lens. Thus for water which has an index of refraction of 1.47, a line width at 193 nm of 35 nm is possible.

Currently, extensive and proven immersion lithography systems do not yet exist. See, for instance, *Chemical and Engineering News*, pages 18-24 (Jun. 28, 2004). Reliable and convenient photoresist and imaging processes for immersion lithography are clearly needed.

It would be desirable to new materials and processes for immersion photolithography.

We now provide new compositions and processes for immersion photolithography.

More particularly, in a first aspect, we provide new overcoating (top coat or barrier layer) compositions that are applied above a photoresist composition layer and preferably can at least inhibit migration of components of the photoresist layer into a fluid (e.g. water) employed in an immersion lithography process.

Preferred barrier layers of the invention include those that contain one or more non-solvent carrier materials (components) such as one or more resins that do not contain fluorine substitution at least in the resin backbone.

Barrier compositions of the invention may comprise a variety of materials and preferred barrier composition components are higher molecular weight materials such as materials having a molecular weight in excess of about 500, 1000, 1500 or 2000 daltons. Preferred barrier composition materials also include those that are substantially lithographically inert, i.e. materials that do not undergo bond-breaking reactions during typical lithographic processing steps of pre-exposure and post-exposure thermal treatments, imaging, or otherwise react with immersion fluid.

Preferred barrier composition materials include resins that contain Si and/or hetero atom (particularly N, O or S, especially O or S) substitution. Additional preferred barrier composition materials may comprise zirconia and/or hafnia, which can be useful to provide a composition of increased refractive index. Preferred barrier composition materials also will be substantially free of aromatic groups (e.g., less than about 5, 4, 3, 2, or 1 weight percent of total composition being aromatic groups) such as phenyl, naphthyl or anthracenyl to avoid excessive absorbance of exposure radiation such as sub-300 nm exposure radiation (e.g. 248 nm) or sub-200 nm radiation (e.g. 193 nm). Aliphatic polymers (i.e. polymers that have essentially or completely no aromatic content) are preferred, including those that comprise carbonate, ester, ether, hydroxy or other polar group substitution. Particularly preferred barrier layers for use in an immersion lithography process include resins that comprise Si atoms, such as one or more organopolysilcia materials particularly one or more silsesquioxane or siloxane resins.

Particularly preferred barrier compositions of the invention can at least inhibit migration of one or more components from an underlying photoresist composition layer into the immersion fluid (e.g. water or some type of aqueous composition) positioned between the exposure tool and the barrier composition layer. As should be understood, the term "immersion fluid" as referred to herein means a fluid (e.g. water) interposed between an exposure tool and a photoresist coated substrate to conduct immersion lithography.

We have found that migration of acid from a photoresist layer into the immersion fluid layer can be particularly problematic. Among other things, the acid or other photoresist materials that migrate into the immersion fluid can damage the exposure tool as well as reduce resolution of an image patterned into a photoresist layer.

As referred to herein, a barrier layer will be considered as inhibiting the migration of photoresist material into immersion fluid if a decreased amount of acid or organic material is detected in the immersion fluid upon use of the barrier composition relative to the same photoresist system that is processed into the same manner, but in the absence of the barrier composition layer. Detection of photoresist material in the immersion fluid can be conducted as described in Example 8 which follows and includes mass spectroscopy analysis of the immersion fluid before exposure to the photoresist (with and without the overcoated barrier composition layer0 and then after lithographic processing of the photoresist layer with exposure through the immersion fluid. Preferably, the barrier composition provides at least a 10 percent reduction in photoresist material (again, acid or organics as detected by mass spectroscopy) residing in the immersion fluid relative to the same photoresist that does not employ any barrier layer (i.e. immersion fluid directly contacts the photoresist layer), more preferably the barrier composition provides at least a 20, 50, or 100 percent reduction photoresist material (again, acid or organics) residing in to the immersion fluid relative to the same photoresist that does not employ any barrier layer.

In a further aspect, the invention provides new methods for lithographic processing in an immersion exposure protocol. Preferred methods of the invention may include the following steps:

1) apply a photoresist composition (e.g. by spin coating) to a substrate such as a semiconductor wafer. The photoresist may be suitably applied on the wafer surface or a material previously applied over the wafer such as an organic or inorganic antireflective composition, or a planarizing layer, and the like;

2) optionally thermally treat the applied photoresist composition to remove solvent carrier, e.g. at about 120° C. or less for about 30 to 60 seconds. In preferred aspects of the invention, however, the photoresist composition solvent carrier is not removed by thermal treatment prior to applying a barrier composition;

3) above the photoresist composition, apply a barrier composition of the invention, e.g. by spin coating. The coated substrate then may be thermally treated to remove solvent carrier of the barrier composition and preferably as discussed the photoresist composition, if that solvent has not already been removed;

4) exposing the overcoated photoresist layer to patterned activating radiation with a fluid (e.g. a fluid comprising water) interposed between the exposure tool and the coated substrate, i.e. immersion exposing the photoresist layer by a fluid layer interposed between the exposure tool and the barrier composition layer. The interposed fluid typically contacts the barrier composition.

In yet another aspect, the invention provides further methods for lithographic processing in an immersion exposure protocol, where undesired migration or other transfer of photoresist composition component(s) can be reduced. These methods in general include a treatment or washing of a photoresist composition layer with a solvent composition (aqueous or non-aqueous). If desired, a barrier composition layer may be applied over the photoresist composition layer that has been treated with the solvent composition, but use of a barrier composition layer is not required.

Such a solvent composition treatment step can remove photoresist composition materials that can migrate into the immersion fluid during subsequent exposure.

In such methods, suitably a solvent composition is applied such as by spin coating to a photoresist composition layer. The photoresist composition layer optionally may have solvent carrier removed such as by thermal treatment prior to the solvent composition treatment step. The solvent treatment composition may be an aqueous composition (e.g. water or water/organic mixture) or a non-aqueous component and comprise one or more organic solvents, preferably one or more polar solvents such as one or more alcohols such as isopropanol and the like. A water/isopropanol solvent mixture for the treatment step also is preferred. The solvent composition then may be substantially removed such as by further spinning and the barrier composition applied over the photoresist composition layer. As mentioned, if desired, a barrier composition may be applied such as by spin coating over the solvent composition-treated photoresist composition layer.

Preferred imaging wavelengths of lithographic systems of the invention include sub-300 nm wavelengths e.g. 248 nm, and sub-200 nm wavelengths e.g. 193 nm. Particularly preferred photoresists for use in systems of the invention may contain a photoactive component (e.g. one or more photoacid generator compounds) one or more resins that are chosen from among:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, as well as blends of i) and/or ii) and/or iii);

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, and iii) polymers that contain polymerized anhydride units, particularly polymerized maleic anhydride and/or itaconic anhydride units, such as disclosed in European Published Application EP01008913A1 and U.S. Pat. No. 6,048,662, as well as blends of i) and/or ii) and/or iii);

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norbornene group and/or an anhydride unit such as provided by polymerization of a maleic anhydride or itaconic anhydride. Such resins are disclosed in PCT/US01/14914 and U.S. application Ser. No. 09/567,634.

4) a resin that contains fluorine substitution (fluoropolymer), e.g. as may be provided by polymerization of tetrafluoroethylene, a fluorinated aromatic group such as fluoro-styrene compound, compounds that comprise a hexafluoroalcohol moiety, and the like. Examples of such resins are disclosed e.g. in PCT/US99/21912.

The invention further provides methods for forming a photoresist relief image and producing an electronic device. The invention also provides novel articles of manufacture comprising substrates coated with a barrier layer composition of the invention alone or in combination with a photoresist composition.

Other aspects of the invention are disclosed infra.

As discussed above, in a first aspect, methods for processing a photoresist composition, the methods comprising:

(a) applying on a substrate a photoresist composition;

(b) applying above the photoresist composition a barrier composition that comprises one or more components other than resin having fluorinated backbone substitution;

(c) immersion exposing the photoresist layer to radiation activating for the photoresist composition.

In such methods, preferably the barrier composition comprises one or more non-fluorinated resins. Also, the barrier composition comprises one or more resins that comprise Si atoms, such as one or more organo polysilica resins. In another aspect, the barrier composition may comprise one or more resins that comprise ester, ether, sulfone, or sulfide groups. The barrier composition also may comprise a component that comprises fluorine substitution, which may be the same or different than the one or more resins.

In such methods, a fluid having a refractive index of between about 1 and about 2 is suitably maintained between an exposure tool and the barrier composition during the exposing. A variety of photoresists may be employed in these methods of the invention, e.g. chemically-amplified positive-acting photoresists and negative-acting photoresists.

In some aspects of these methods of the invention the photoresist composition will not be not thermally treated prior to applying the barrier composition. Also, in some aspects of these methods of the invention, the substrate with the applied photoresist composition and barrier composition is thermally treated prior to exposing to remove solvent from both the applied photoresist composition and the applied barrier composition.

In preferred aspects of the invention, the barrier composition inhibits migration of one or more components of the photoresist composition into fluid interposed between the barrier composition and exposure tool used for exposing.

Methods and systems of the invention can be used with a variety of imaging wavelengths, e.g. radiation having a wavelength of less than 300 nm such as 248 nm or less than 200 such as 193 nm.

In another embodiment, methods are provided for processing a photoresist composition, comprising (a) applying on a substrate a photoresist composition; (b) treating the applied photoresist composition with a fluid composition; and (c) immersion exposing the photoresist layer to radiation activating for the photoresist composition. The photoresist composition may be treated with a variety of fluid compositions, including aqueous fluid compositions as well as fluid compositions that comprise one or more organic solvents. In certain aspects, a barrier composition may be applied above the treated photoresist composition layer, preferably a barrier composition as discussed above e.g. a barrier composition that comprises one or more non-fluorinated resins, and/or one or more resins that comprise Si atoms such as one or more organo polysilica resins.

In another embodiment, immersion lithography systems are provided such as a coated substrate system comprising: a substrate having thereon: 1) a coating layer of a photoresist composition; and 2) a coating layer of a barrier composition above the photoresist composition layer, the barrier composition comprising one or more non-fluorinated components; and 3) an immersion photolithography exposure tool. The barrier composition above the treated photoresist composition layer may be as discussed above e.g. a barrier composition that comprises one or more non-fluorinated resins, and/or one or more resins that comprise Si atoms such as one or more organo polysilica resins.

Particularly preferred organic barrier coating composition of the invention that are adapted for use with an underlying photoresist composition in an immersion photolithography process may comprise or more silsesquioxane resins and one or more fluorinated organic resins.

Barrier Compositions

As discussed above, preferred barrier layers of the invention include those that contain one or more non-solvent carrier materials (components) such as one or more resins that do not contain fluorine substitution at least along the resin backbone. Such backbone-fluorinated resins are typically provided by polymerization of a fluorinated olefin such as tetrafluoroethylene and the like. In at least some aspects, barrier compositions of the invention may contain fluorinated resins where the fluorine substitution is of a pendant groups such as —C(OH)(CF$_3$)$_2$ or a pendant alkyl or alicyclic group (e.g. fused or non-fused norbornyl, pendant adamantly, etc.) that has one or more fluorine atoms.

Barrier compositions of the invention may comprise a variety of materials and preferred barrier composition components are higher molecular weight materials such as materials having a molecular weight in excess of about 500, 1000, 1500 or 2000 daltons. Preferably, the barrier composition contains only materials that are substantially lithographically inert, i.e. materials that do not undergo bond-breaking reactions during typical lithographic processing steps of pre-exposure and post-exposure thermal treatments, imaging, or otherwise react with immersion fluid.

Preferred barrier composition materials include resins that contain Si and/or hetero atom (particularly N, O or S, especially O or S) substitution, or other substitution as discussed above such as zirconia or hafnia. Preferred barrier composition materials also will be substantially free of aromatic groups such as phenyl, naphthyl or anthracenyl to avoid excessive absorbance of exposure radiation such as sub-300 nm exposure radiation (e.g. 248 nm) or sub-200 nm radiation (e.g. 193 nm). Also preferred are aliphatic polymers that suitably comprises carbonate, ester, ether, hydroxy or other polar group substitution. Particularly preferred barrier layers for use in an immersion lithography process include resins that comprise Si atoms.

Preferred barrier composition layers will have an index of refraction of about 1.4 or greater at 193 nm including about 1.47 or greater at 193 nm. Additionally, for any particular system, the index of refraction can be tuned by changing the composition of the resin(s) of the barrier composition, including by altering the ratio of components of a resin blend, or composition of any of the resin(s) of a barrier composition. For instance, increasing the amount of organic content in a barrier layer composition can provided increased refractive index of the layer.

Preferred barrier layer compositions will have a refractive index between of the immersion fluid and the refractive index of the photoresist at the target exposure wavelength (e.g. 193 nm or 248 nm).

Particularly preferred barrier compositions comprises an organic polysilica film composition suitably with solubility in polar solvents such as isopropanol and ethanol. Such organic polysilica films may be prepared using a partial condensate of one or more organosilanes and one or more silicon-containing cross-linking agents, wherein the cross-linking agent contains >4 hydrolyzable groups. Particularly suitable silicon-containing cross-linking agents have 5 or 6 hydrolyzable groups. As used herein, the term "partial condensate" refers to a silane oligomer or prepolymer or hydrolyzate that is capable of undergoing further condensation reactions to increase its molecular weight.

Such organic polysilica partial condensates may be suitably prepared methods that include the steps of: a) reacting a mixture including one or more silanes of formula (I) $R_a SiY_{4-a}$ and one or more silanes of formula (II) $R^1_b(R^{20})_{3-b}Si(R^3)_c Si(OR^4)_{3-d}R^5_d$ in the presence of a basic catalyst; and b) reacting the mixture in the presence of an acidic catalyst; wherein R is hydrogen, $(C_1-C_8)$alkyl, $(C_7-C_{12})$arylalkyl, substituted $(C_7-C_{12})$arylalkyl, aryl, and substituted aryl; Y is any hydrolyzable group; a is an integer of 1 to 2; $R^1$, $R^2$, $R^4$ and $R^5$ are independently selected from hydrogen, $(C_1-C_6)$alkyl, $(C_7-C_{12})$arylalkyl, substituted $(C_7-C_{12})$aryl-alkyl, aryl, and substituted aryl; $R^3$ is $(C_1-C_{10})$alkyl, —$(CH_2)_h$—, —$(CH_2)_{h1}$-$E_k$-$(CH_2)_{h2}$—, —$(CH_2)_h$—Z, arylene, substituted arylene, or arylene ether; E is oxygen, $NR^6$ or Z; Z is aryl or substituted aryl; $R^6$ is hydrogen, $(C_1-C_6)$alkyl, aryl or substituted aryl; b and d are each an integer of 0 to 2; c is an integer of 0 to 6; and h, h1, h2 and k are independently an integer from 1 to 6; provided that at least one of R, $R^1$, $R^3$ and $R^5$ is not hydrogen.

In one embodiment, R is $(C_1-C_4)$alkyl, benzyl, hydroxybenzyl, phenethyl or phenyl, and more preferably methyl, ethyl, iso-butyl, tert-butyl or phenyl. Suitable hydrolyzable groups for Y include, but are not limited to, halo, $(C_1-C_6)$ alkoxy, acyloxy and the like, and preferably chloro and $(C_1-C_2)$alkoxy. Suitable organosilanes of formula (I) include, but are not limited to, methyl trimethoxysilane, methyl triethoxysilane, phenyl trimethoxysilane, phenyl triethoxysilane, tolyl trimethoxysilane, tolyl triethoxysilane, propyl tripropoxysilane, iso-propyl triethoxysilane, iso-propyl tripropoxysilane, ethyl trimethoxysilane, ethyl triethoxysilane, iso-butyl triethoxysilane, iso-butyl trimethoxysilane, tert-butyl triethoxysilane, tert-butyl trimethoxysilane, cyclohexyl trimethoxysilane, cyclohexyl triethoxysilane, benzyl trimethoxysilane, benzyl triethoxysilane, phenethyl trimethoxysilane, hydroxybenzyl trimethoxysilane, hydroxyphenylethyl trimethoxysilane and hydroxyphenylethyl triethoxysilane.

Organosilanes of formula (II) preferably include those wherein $R^1$ and $R^5$ are independently $(C_1-C_4)$alkyl, benzyl, hydroxybenzyl, phenethyl or phenyl. Preferably $R^1$ and $R^5$ are methyl, ethyl, tert-butyl, iso-butyl and phenyl. In one embodiment, $R^3$ is $(C_1-C_{10})$alkyl, —$(CH_2)_h$—, arylene, arylene ether and —$(CH_2)_{h1}$-E-$(CH_2)_{h2}$. Suitable compounds of formula (II) include, but are not limited to, those wherein $R^3$ is methylene, ethylene, propylene, butylene, hexylene, norbornylene, cyclohexylene, phenylene, phenylene ether, naphthylene and —$CH_2$—$C_6H_4$—$CH_2$—. In a further embodiment, c is 1 to 4.

Suitable organosilanes of formula (II) include, but are not limited to, bis(trimethoxysilyl)methane, bis(triethoxysilyl)methane, bis(triphenoxysilyl)methane, bis(dimethoxymethylsilyl)methane, bis(diethoxymethyl-silyl)methane, bis(dimethoxyphenylsilyl)methane, bis(diethoxyphenylsilyl)methane, bis(methoxydimethylsilyl)methane, bis(ethoxydimethylsilyl)methane, bis(methoxy-diphenylsilyl)methane, bis(ethoxydiphenylsilyl)methane, bis(trimethoxysilyl)ethane, bis(triethoxysilyl)ethane, bis(triphenoxysilyl)ethane, bis(dimethoxymethylsilyl)ethane, bis(diethoxymethylsilyl)ethane, bis(dimethoxyphenylsilyl)ethane, bis(diethoxyphenyl-silyl)ethane, bis(methoxydimethylsilyl)ethane, bis(ethoxydimethylsilyl)ethane, bis(methoxy-diphenylsilyl)ethane, bis(ethoxydiphenylsilyl)ethane, 1,3-bis(trimethoxysilyl))propane, 1,3-bis(triethoxysilyl)propane, 1,3-bis(triphenoxysilyl)propane, 1,3-bis(dimethoxymethylsilyl)propane, 1,3-bis(diethoxymethylsilyl)propane, 1,3-bis(dimethoxyphenyl-silyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane, and 1,3-bis(ethoxydiphenylsilyl)propane.

Suitable organic polysilica materials include, but are not limited to, silsesquioxanes, partially condensed halosilanes or alkoxysilanes such as partially condensed by controlled hydrolysis tetraethoxysilane having number average molecular weight of 500 to 20,000, organically modified silicates having the composition $RSiO_3$, $O_3SiRSiO_3$, $R_2SiO_2$ and $O_2SiR_3SiO_2$ wherein R is an organic substituent, and partially condensed orthosilicates having $Si(OR)_4$ as the monomer unit. Silsesquioxanes are polymeric silicate materials of the type $RSiO_{1.5}$ where R is an organic substituent. Suitable silsesquioxanes are alkyl silsesquioxanes; aryl silsesquioxanes; alkyl/aryl silsesquioxane mixtures; and mixtures of alkyl silsesquioxanes. Silsesquioxane materials include homopolymers of silsesquioxanes, copolymers of silsesquioxanes or mixtures thereof. Such materials are generally commercially available or may be prepared by known methods.

In an alternate embodiment, the organic polysilica materials may contain a wide variety of other monomers in addition to the silicon-containing monomers described above. For example, the organic polysilica materials may further comprise a second cross-linking agent, and carbosilane moieties.

Suitable second cross-linking agents may be any known cross-linkers for silicon-containing materials. Typical second cross-linking agents include silanes of formula (III) $M^n(OR^{11})_n$ wherein M is aluminum, titanium, zirconium, hafnium, silicon, magnesium, or boron; $R^{11}$ is $(C_1-C_6)$alkyl, acyl, or $Si(OR^{12})_3$; $R^{12}$ is $(C_1-C_6)$alkyl or acyl; and n is the valence of M. In one embodiment, $R^{11}$ is methyl, ethyl, propyl or butyl. In another embodiment, M is aluminum, titanium, zirconium, hafnium or silicon. It will be appreciated by those skilled in the art that a combination of such second cross-linkers may be used. The ratio of the mixture of silanes of formulae (I) and (II) to such second cross-linking agents organosilanes is typically from 99:1 to 1:99, preferably from 95:5 to 5:95, more preferably from 90:10 to 10:90.

Carbosilane moieties refer to moieties having a $(Si—C)_x$ structure, such as $(Si-A)_x$ structures wherein A is a substituted or unsubstituted alkylene or arylene, such as $SiR_3CH_2$—, —$SiR_2CH_2$—, =$SiRCH_2$—, and =$SiCH_2$—, where R is usually hydrogen but may be any organic or inorganic radical. Suitable inorganic radicals include organosilicon, siloxyl, or silanyl moieties. These carbosilane moieties are typically connected "head-to-tail", i.e. having Si—C—Si bonds, in such a manner that a complex, branched structure results. Particularly useful carbosilane moieties are those having the repeat units $(SiH_xCH_2)$ and $(SiH_{y-1}(CH=CH_2)CH_2)$, where x=0 to 3 and y=1 to 3. These repeat units may be present in the organic polysilica resins in any number from 1 to 100,000, and preferably from 1 to 10,000. Suitable carbosilane precursors are those disclosed in U.S. Pat. No. 5,153,295 (Whitmarsh et al.) and U.S. Pat. No. 6,395,649 (Wu).

The organic polysilica partial condensates may be prepared by reacting one or more tri- or di-functional organo silanes such as those of formula I, one or more silicon-containing cross-linking agents such as those of formula II, and typically water, for a period of time sufficient to hydrolyze (or partially condense) the silanes to form a partial condensate having the desired weight average molecular weight. Typically, the reaction temperature is 78-80° C. due to the boiling point of ethanol. The amount of water is typically from 0.1 to 2.0 mole equivalents, more typically from 0.25 to 1.75 mole equivalents, and even more typically from 0.75 to 1.5 mole equivalents. An acidic or basic catalyst is typically used. Suitable acids and bases include strong acids and strong bases such as hydrochloric acid and tetramethylammonium hydroxide respectively weak acids and bases such as acetic acid or triethyl amine respectively. Typically strong acid catalyst like hydrochloric acid is used to catalyze the hydrolysis and condensation reaction of the silanes. The silanes and water are typically reacted from 0.5 to 48 hours, although longer or shorter times may be used. Particularly suitable reaction times are from 1 to 24 hours. The mole ratios of the silanes may vary over a wide range. The mole ratio of the one or more silanes of formula (I) to the one or more silanes of formula (II) is from 99:1 to 1:99, particularly from 95:5 to 5:95, more particularly from 90:10 to 10:90, and still more particularly from 80:20 to 20:80.

Suitable organic polysilica partial condensates for use in barrier layer compositions may have a wide range of molecular weights. Typically, the partial condensates have a weight average molecular weight of ≤20,000, although higher molecular weights may be used. More typically, the weight average molecular weight is ≤15,000, still more typically ≤10,000, and most typically ≤5,000.

Following formation of the organic polysilica partial condensates, and after optionally removing the acidic catalyst, a stabilizing agent may be optionally added to the partial condensates. Such stabilizing agents are preferably organic acids. Any organic acid having at least 2 carbons and having an acid dissociation constant ("pKa") of about 1 to about 4 at 25° C. is suitable. Preferred organic acids have a pKa of about 1.1 to about 3.9, and more preferably about 1.2 to about 3.5. Organic acids capable of functioning as chelating agents are preferred. Such chelating organic acids include polycarboxylic acids such as di-, tri-, tetra- and higher carboxylic acids, and carboxylic acids substituted with one or more of hydroxyls, ethers, ketones, aldehydes, amine, amides, imines, thiols and the like. Preferred chelating organic acids are polycarboxylic acids and hydroxy-substituted carboxylic acids. The term "hydroxy-substituted carboxylic acids" includes hydroxy-substituted polycarboxylic acids. Suitable organic acids include, but are not limited to: oxalic acid, malonic acid, methylmalonic acid, dimethylmalonic acid, maleic acid, malic acid, citramalic acid, tartaric acid, phthalic acid, citric acid, glutaric acid, glycolic acid, lactic acid, pyruvic acid, oxalacetic acid, ketoglutaric acid, salicylic acid and acetoacetic acid. Preferred organic acids are oxalic acid, malonic acid, dimethylmalonic acid, citric acid and lactic acid, and more preferably malonic acid. Mixtures of organic acids may be advantageously used in the present invention. Those skilled in the art will realize that polycarboxylic acids have a pKa value for each carboxylic acid moiety in the compound. Only one of the pKa values in such polycarboxylic acids needs to be within the range of 1 to 4 at 25° C. for the organic acid to be suitable for use in the present invention. Such stabilizing agents are typically used in an amount of 1 to 10,000 ppm and preferably from 10 to 1000 ppm. Such stabilizing agents function to retard further condensation of the material and extend the shelf-life of the partial condensates.

As discussed above, a variety of other materials also will be useful as components of barrier layer compositions of the invention. More particularly, suitable organic polymers that do not contain perfluoro-backbone substitution may be selected from any non light adsorbing deep UV polymers of, such as, but not limited to, poly(alkylene oxide) monomers, poly(meth)acrylic acid, poly(meth)acrylamides, polyh, aromatic (meth)acrylates, vinyl aromatic monomers, nitrogen-containing compounds and their thio-analogs, substituted ethylene monomers, and combinations thereof.

Particularly useful non-fluorinated organic polymers are those containing as polymerized units at least one compound selected from silyl containing monomers or poly(alkylene oxide) monomers and one or more cross-linking agents. Such porogens are described in U.S. Pat. No. 6,271,273. Suitable silyl containing monomers include, but are not limited to, vinyltrimethylsilane, vinyltriethylsilane, vinyltrimethoxysilane, vinyltriethoxysilane, trimethoxysilylpropyl(meth)acrylate, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), allyloxy-tert-butyfldimethylsilane, allyloxytrimethylsilane, allyltriethoxysilane, allyltri-iso-propylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis(trimethylsilyloxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane and mixtures thereof. The amount of silyl containing monomer useful to form the porogens of the present invention is typically from 1 to 99% wt, based on the total weight of the monomers used. It is preferred that the silyl containing monomers are present in an amount of from 1 to 80% wt, and more preferably from 5 to 75% wt.

Suitable poly(alkylene oxide) monomers include, but are not limited to, poly(propylene oxide) monomers, poly(ethylene oxide) monomers, poly(ethylene oxide/propylene oxide) monomers, poly(propylene glycol) (meth)acrylates, poly (propylene glycol) alkyl ether(meth)acrylates, poly(propylene glycol) phenyl ether(meth)acrylates, poly(propylene glycol) 4-nonylphenol ether(meth)acrylates, poly(ethylene glycol) (meth)acrylates, poly(ethylene glycol) alkyl ether (meth)acrylates, poly(ethylene glycol) phenyl ether(meth) acrylates, poly(propylene/ethylene glycol) alkyl ether(meth) acrylates and mixtures thereof. Preferred poly(alkylene oxide) monomers include trimethoylolpropane ethoxylate tri (meth)acrylate, trimethoylolpropane propoxylate tri(meth) acrylate, poly(propylene glycol) methyl ether acrylate, and the like. Particularly suitable poly(propylene glycol) methyl ether acrylate monomers are those having a molecular weight in the range of from 200 to 2000. The poly(ethylene oxide/ propylene oxide) monomers useful in the present invention may be linear, block or graft copolymers. Such monomers typically have a degree of polymerization of from 1 to 50, and preferably from 2 to 50. Typically, the amount of poly(alkylene oxide) monomers useful in the porogens of the present invention is from 1 to 99% wt, based on the total weight of the monomers used. The amount of poly(alkylene oxide) monomers is preferably from 2 to 90% wt, and more preferably from 5 to 80% wt.

The silyl containing monomers and the poly(alkylene oxide) monomers may be used either alone or in combination to form the porogens of the present invention. In general, the amount of the silyl containing monomers or the poly(alkylene oxide) monomers needed to compatiblize the porogen with the dielectric matrix depends upon the level of porogen loading desired in the matrix, the particular composition of the organo polysilica dielectric matrix, and the composition of the porogen polymer. When a combination of silyl containing monomers and the poly(alkylene oxide) monomers is used, the amount of one monomer may be decreased as the amount of the other monomer is increased. Thus, as the amount of the silyl containing monomer is increased in the combination, the amount of the poly(alkylene oxide) monomer in the combination may be decreased.

Exemplary cross-linkers include, but are not limited to: trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate, ethyleneglycol dimethacrylate, diethyleneglycol dimethacrylate, propyleneglycol dimethacrylate, propyleneglycol diacrylate, trimethylolpropane trimethacrylate, divinyl benzene, glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol)diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, and mixtures thereof. Silyl containing monomers that are capable of undergoing cross-linking may also be used as cross-linkers, such as, but not limited to, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), tetraallylsilane, 1,3-dimethyl tetravinyldisiloxane, 1,3-divinyl tetramethyldisiloxane and mixtures thereof.

Preferred solvent materials to formulate and cast a barrier composition are any which dissolve or disperse the component(s) of the barrier layer composition (e.g., one or more resins) but do not appreciably dissolve an underlying photoresist layer. More particularly, suitable solvents to formulate a barrier composition include one or more of, but are not limited to, alcohols such as isopropanol, n-butanol, alkylene glycols, such as propylene glycol. Alternatively non-polar solvents such as aliphatic and aromatic hydrocarbons such as dodecane, isooctane, mesitylene and xylenes may be used.

A barrier composition may be suitably preferred by admixture of one or more solid components (e.g. one or more resins) into one or more polar solvents such as those identified above or alternatively one or more non-polar solvents such as the aliphatic and aromatic hydrocarbons identified above. See the examples which follow for exemplary procedures for preparation of barrier compositions of the invention.

As used herein, the following abbreviations shall have the following meanings, unless the context clearly indicates otherwise: ° C.=degrees centigrade; μm=micron=micrometer; UV=ultraviolet; rpm=revolutions per minute; min.=minute; hr.=hour; nm=nanometer; g=gram; % wt=% by weight; L=liter; mL=milliliter; ppm=parts per million; GPa=gigaPascals; Mw=weight average molecular weight; Mn=number average molecular weight.

The term "(meth)acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. The term "polymer" includes both homopolymers and copolymers. The terms "oligomer" and "oligomeric" refer to dimers, trimers, tetramers and the like. "Monomer" refers to any ethylenically or acetylenically unsaturated compound capable of being polymerized. Such monomers may contain one or more double or triple bonds. "Cross-linker" and "cross-linking agent" are used interchangeably throughout this specification and refer to a compound having two or more groups capable of being polymerized. As used herein, the terms "cure" and "curing" refer to polymerization, condensation or any other reaction where the molecular weight of a compound is increased. The step of solvent removal alone is not considered "curing" as used in this specification. However, a step involving both solvent removal and, e.g., polymerization is within the term "curing" as used herein. The term "organic polysilica" material (or organo siloxane) refers to a material including silicon, carbon, oxygen and hydrogen atoms. "Silane" as used herein refers to a silicon-containing material capable of undergoing hydrolysis and/or condensation. The articles "a" and "an" refer to the singular and the plural.

Photoresists

A wide variety of photoresist compositions may be used in combination with barrier layer compositions and processes of the invention.

As discussed above, preferred photoresists for use in accordance with the invention include positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Ester groups that contain a tertiary non-cyclic alkyl carbon (e.g. t-butyl) or a tertiary alicyclic carbon (e.g. methyladamantyl) covalently linked to the carboxyl oxygen of the ester are often preferred photoacid-labile groups of resins employed in photoresists of the invention. Acetal photoacid-labile groups also will be preferred.

The photoresists of the invention typically comprise a resin component and a photoactive component of the invention as described above. Preferably the resin has functional groups that impart alkaline aqueous developability to the resist composition. For example, preferred are resin binders that comprise polar functional groups such as hydroxyl or carboxylate. Preferably a resin component is used in a resist composition in an amount sufficient to render the resist developable with an aqueous alkaline solution.

For imaging at wavelengths greater than 200 nm, such as 248 nm, phenolic resins are typically preferred. Preferred phenolic resins are poly (vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Also preferred for imaging at wavelengths greater than 200 nm, such as 248 nm are chemically amplified photoresists that comprise in admixture a photoactive component and a resin component that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

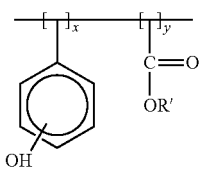

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

Other preferred resins that have acid-labile deblocking groups for use in a positive-acting chemically-amplified photoresist of the invention have been disclosed in European Patent Application 0829766A2 of the Shipley Company (resins with acetal and ketal resins) and European Patent Application EP0783136A2 of the Shipley Company (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

As discussed above, for imaging at sub-200 nm wavelengths such as 193 nm, preferably a photoresist is employed that contains one or more polymers that are substantially, essentially or completely free of phenyl or other aromatic groups. For example, for sub-200 nm imaging, preferred photoresist polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a PAG of the invention to provide a photoresist for sub-200 nm imaging are disclosed in European application EP930542A1 and U.S. Pat. Nos. 6,692,888 and 6,680,159, all of the Shipley Company.

Suitable polymers that are substantially or completely free of aromatic groups suitably contain acrylate units such as photoacid-labile acrylate units as may be provided by polymerization of methyladamanatylacrylate, methyladamantylmethacrylate, ethylfenchylacrylate, ethylfenchylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride and/or itaconic anhydride; and the like.

Preferred negative-acting compositions of the invention comprise a mixture of materials that will cure, crosslink or harden upon exposure to acid, and a photoactive component of the invention. Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

For imaging at sub-200 nm wavelengths such as 193 nm, preferred negative-acting photoresists are disclosed in WO 03077029 to the Shipley Company.

Photoresists of the invention also may contain other materials. For example, other optional additives include actinic and contrast dyes, anti-striation agents, plasticizers, speed enhancers, sensitizers (e.g. for use of a PAG of the invention at longer wavelengths such as I-line (i.e. 365 nm) or G-line wavelengths), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, e.g. a caprolactam, which can enhance resolution of a developed resist relief image. The added base is suitably used in relatively small amounts, e.g. about 1 to 10 percent by weight relative to the PAG, more typically 1 to about 5 weight percent. Other suitable basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

The resin component of resists useful in accordance with the invention are typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

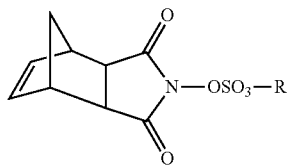

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

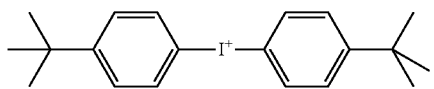

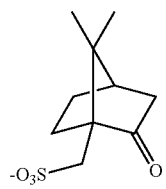

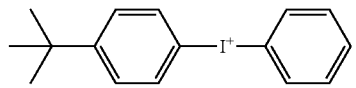

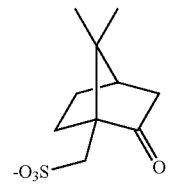

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in photoresists used in accordance with the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists used in accordance with the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

Negative-acting photoresists of the invention typically will contain a crosslinking component, preferably as a separate resist component. Amine-based crosslinkers often will be preferred such as a melamine, e.g. the Cymel melamine resins.

The photoresists used in accordance with the invention are generally prepared following known procedures. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition. Blends of such solvents also are suitable.

Lithographic Processing

Liquid photoresist compositions may be applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed. Photoresists also may be suitably applied over an antireflective layer, particularly an organic antireflective layer.

As discussed above, an applied photoresist composition layer may be preferably treated with a solvent composition, e.g. a solvent composition comprising one or more aqueous and/or organic solvents such as an alcohol. Such solvent composition-treatment can reduce undesired migration of photoresist materials into immersion fluid during immersion exposure.

If a barrier composition layer is employed, the barrier composition can be applied over the photoresist composition by any suitable methods, with spin coating being preferred.

Following coating of the photoresist onto a surface, it may be dried by heating to remove the solvent until preferably the photoresist coating is tack free, or as discussed above, the photoresist layer may be dried after the barrier layer composition has been applied and the solvent from both the photoresist composition and barrier composition layers substantially removed in a single thermal treatment step.

The photoresist layer (with overcoated barrier composition layer, if present) in then exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The photoresist composition layer is then suitably patterned exposed to activating radiation with the exposure energy typically ranging from about 1 to 100 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component (e.g. producing photoacid from the photoacid generator compound).

As discussed above, photoresist compositions are preferably photoactivated by a short exposure wavelength, particularly a sub-300 and sub-200 nm exposure wavelength, with 248 nm and 193 nm being particularly preferred exposure wavelengths as well as EUV and 157 nm.

Following exposure, the film layer of the composition is preferably baked at temperatures ranging from about 70° C. to about 160° C. Thereafter, the film is developed, preferably by treatment with an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

The following non-limiting examples are illustrative of the invention.

EXAMPLE 1

Barrier Composition Preparation

A top layer (barrier) coating solution was prepared by charging a polyethylene container with 10.62 g of a hydrozylate of 55 wt % methyltriethoxysilane and 45 wt % tetraethylorthosilicate at a solution solids of 27% in propylene glycol monomethylether acetate and 1.99 g of an acrylate copolymer comprised of 90 wt % Cognis Photomer 8061 and 10 wt % UCB TMPTA-N at a solution solids of 93% in propylene glycol monomethyl ether acetate solvent. The organo-polysilica was prepared as described above and in published patent documents of the Shipley Company while the organic polymer was prepared according to the method disclosed in U.S. Pat. No. 6,271,273 (You et al.) and U.S. Pat. No. 6,420,441.

To the polymers was added 215 g of isopropanol and the solution was shaken to form a homogeneous solution. The sample was ion-exchanged thru a bed of Amberlite IRN 150, a product of the Rohm and Haas Company, Philadelphia Pa., and then filtered through a 0.2 micron polytetarafluoroethylene filter disk.

EXAMPLE 2-6

Barrier Compositions Preparation

Based on the procedure outlined in Example 1, additional top coat samples were prepared from the same organopolysilica polymer described in Example 1. The composition of organic polymer is shown in Table 1 and the solution solids of each sample was 15% by weight (balance of composition isopropanol (IPA) carrier solvent).

TABLE 1

Composition of Top Layer Coating in Examples 2-6

| Example | Organo-polysilica Grams | Organic Polymer Grams | Organic Polymer Composition | Ratio Wt % | Isopropanol Grams |
|---|---|---|---|---|---|
| 2 | 1.848 | 2.136 | HOPPOMA/EDMA/DMAEMA | 85/10/5 | 25.006 |
| 3 | 1.848 | 2.136 | PPG260A/AA/TMPTMA | 87/3/10 | 25.006 |
| 4 | 1.848 | 2.136 | HOPPOMA/EDMA/MAA | 85/10/5 | 25.006 |
| 5 | 1.848 | 2.136 | 2-EHA/α-MeStyrene/TMPTA | 60/30/10 | 25.006 |
| 6 | 3.911 | 0.0 | None | — | 25.089 |

EXAMPLE 7

Processing of Barrier Compositions

Coating samples of Examples 1-6 were spin coated on a Site Services Tractrix 200 mm track. The solutions were disposed from a pipette onto a wafer while the wafer was stationary. The 200 mm wafer was spun at a spin speed of 1500-2500 rpm to achieve the desired film thickness. In the process of spinning the film, excess solvent is also removed from the film. To remove the remainder of the solvent from the film the wafer was heated on a hot plate at 90° C. to dry the film.

Coating Process

The top layer coating compositions were spin coated onto uncoated silicon wafers to determine thickness and optical properties of the coatings. The samples were then spin coated on to silicon wafers where a methacrylate based 193 nm photoresist had already been deposited. The resist was deposit from propyleneglycol monomethyl ether acetate and then optionally cured at 120° C. for 1 minute. The results of an isopropanol (IPA) rinse step or top layer coating deposition on top of the resist layer are shown in tables 2 and 3. For the soft bake resist sample, the coating was unaffected by the IPA rinse step with minimal film loss. For the non-soft baked sample the film thickness loss was approximately 25 nm. In both cases, good quality top layer films were prepared from deposition of Example 1.

TABLE 2

Effect of isopropanol rinse and top layer coating deposition on resist layer thickness (after intermediate soft bake of Photoresist Layer)

| Coating | Coating | Initial Thickness | Composition of IPA Solution | Thickness After IPA Solution | Thickness of Film from IPA Solution |
|---|---|---|---|---|---|
| 1 | XP-1020A | 2430 Å | IPA only | 2428 Å | −2 Å |
| 2 | XP-1020A | 2775 Å | Example 1/IPA | 3550 Å | 774 Å |

TABLE 3

Effect of isopropanol rinse and top layer coating deposition on resist layer thickness (without intermediate soft bake of Photoresist Layer)

| Coating | Coating | Initial Thickness | Composition of IPA Solution | Final Thickness After Coating | Thickness of Film from IPA Solution |
|---|---|---|---|---|---|
| 3 | XP-1020A | 2963 Å | IPA only | 2938 Å | −25 Å |
| 4 | XP-1020A | 2967 Å | Example 1/IPA | 3609 Å | 635 Å |

Stack Formation

To measure barrier performance, wafers were coated with a 60 nm thick a commercially available organic antireflective layer cured at 215° C. and then coated a methacrylate based 193 nm photoresist. The resist was then optionally soft baked prior to deposition of top coat layer. Isopropanol was optionally applied to the wafers to prewet and rinse the surface of the resist prior to the deposition of the top coat. After deposition of the top coat layer the films were soft baked at a temperature of 90 or 120° C. for 1 minute.

EXAMPLE 8

Barrier Composition Layer Performance

The stack wafers were either left unexposed or exposed to 193 nm radiation. Next the wafers were all soft baked at 120° C. for 1 minute, the standard post exposure bake temperature for the methacrylate based resist. A 1 mL de-ionized water droplet was then placed in contact with the wafer in a restricted area using a PTFE o-ring for a period of 60 seconds. The droplet was then removed and analyzed by LC/mass spec for the photoacid in the resist and its photo-degradation byproducts to determine the efficacy of the prewet prerinse and top coat layer materials to reduce the contamination in the water phase (immersion fluid).

TABLE 4

Barrier Performance as a Function of Top Layer Composition and Prewet/Rinse Step

| Top Layer | IPA Prewet | Water Prerinse | Pre Exposure | Post Exposure |
|---|---|---|---|---|
| None | No | no | 17.9 | 31.4 |
| None | yes | no | 5.9 | 13.2 |
| None | No | yes | 1.4 | 11.5 |
| Example 1 | No | no | 2.2 | 10.0 |
| Example 1 | No | yes | 1.0 | 4.0 |
| None | No | no | 17.1 | 35.6 |
| Example 2 | No | no | 2.7 | 4.3 |
| Example 3 | No | no | 29.7 | 53.9 |
| Example 4 | No | no | 13.8 | 40.7 |
| Example 5 | No | no | 2.4 | 9.2 |
| Example 6 | No | no | 0.9 | 2.2 |

EXAMPLE 9

Lithographic Processing

The following lithographic results (set forth in Table 5 below) were obtained upon patterned exposure (193 nm) of the photoresist with specified barrier composition layers (i.e. barrier composition layers of Example 1 and 6).

TABLE 5

Exposure Results using an ArF High NA Step and Scan Tool

| Property | Resist | Resist + Barrier Layer (Example 1) | Resist + Barrier Layer (Example 6) | Unit |
|---|---|---|---|---|
| Depth of Focus at 10% Exposure | 0.45 | 0.42 | — | micrometer |
| LER at nominal focus and exposure | 7.0 | 7.2 | 7.3 | nanometer |

EXAMPLE 10

Optical Properties of Barrier Composition Layer

Optical properties of barrier compositions were evaluated at 193 nm and 248 nm. Results are set forth in Table 6 below.

TABLE 6

Optical properties of barrier composition layers

| | Optical Property Wavelength | | | |
|---|---|---|---|---|
| | n 193 nm | k 193 nm | n 248 nm | k 248 nm |
| Example 1 | 1.592 | 0.0022 | 1.511 | 0.0000 |
| Example 6 | 1.543 | 0.0005 | 1.479 | 0.0000 |

What is claimed is:

1. A method for processing a photoresist composition, comprising:
   (a) applying on a substrate a photoresist composition;
   (b) treating the applied photoresist composition with a fluid composition comprising isopropanol to remove photoresist composition materials that can migrate into an immersion fluid during a subsequent step of immersion exposing the photoresist layer; and
   (c) immersion exposing the photoresist layer to radiation activating for the photoresist composition;
   wherein a barrier composition is applied above the treated photoresist composition layer.

2. The method of claim 1 wherein the photoresist composition is treated with an aqueous fluid composition.

3. The method of claim 1 wherein the photoresist composition is treated with a fluid composition that comprises one or more organic solvents.

4. The method of claim 1, wherein the barrier composition comprises one or more resins that comprise Si atoms.

5. The method of claim 1, wherein the barrier coating composition comprising one or more silsesquioxane resins and one or more fluorinated organic resins.

6. The method of claim 1, wherein the fluid composition comprises an alcohol.

7. A method for processing a photoresist composition, comprising:
   (a) applying on a substrate a photoresist composition;
   (b) treating the applied photoresist composition with a fluid composition comprising isopropanol;
   (c) applying a barrier composition above the treated photoresist composition layer; and
   (d) immersion exposing the photoresist layer to radiation activating for the photoresist composition 8. The method of claim 7, wherein the barrier composition comprises one or more resins that comprise Si atoms.

9. The method of claim 7, wherein the barrier coating composition comprises one or more silsesquioxane resins and one or more fluorinated organic resins.

10. The method of claim 7, wherein the step of treating the applied photoresist composition with a fluid composition removes photoresist composition materials that can migrate into an immersion fluid during the step of immersion exposing.

* * * * *